United States Patent
Hatanaka et al.

(10) Patent No.: US 8,652,755 B2
(45) Date of Patent: Feb. 18, 2014

(54) POSITIVE PHOTOSENSITIVE RESIN COMPOSITION AND LYOPHOBIC FILM

(75) Inventors: Tadashi Hatanaka, Funabashi (JP); Megumi Uchiyama, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 13/576,847

(22) PCT Filed: Feb. 1, 2011

(86) PCT No.: PCT/JP2011/052046
§ 371 (c)(1),
(2), (4) Date: Aug. 2, 2012

(87) PCT Pub. No.: WO2011/096400
PCT Pub. Date: Aug. 11, 2011

(65) Prior Publication Data
US 2012/0301827 A1  Nov. 29, 2012

(30) Foreign Application Priority Data
Feb. 2, 2010 (JP) ................................. 2010-021264

(51) Int. Cl.
G03F 7/40 (2006.01)
G03F 7/004 (2006.01)
G03F 7/075 (2006.01)
H01L 21/027 (2006.01)

(52) U.S. Cl.
USPC .......... 430/270.1; 430/18; 430/326; 430/311; 430/330

(58) Field of Classification Search
None
See application file for complete search history.

(56) References Cited

U.S. PATENT DOCUMENTS

| 5,077,174 A | * | 12/1991 | Bauer et al. | 430/270.1 |
| 2007/0020559 A1 | * | 1/2007 | Hatanaka | 430/270.1 |
| 2010/0028805 A1 | | 2/2010 | Hatanaka | |

FOREIGN PATENT DOCUMENTS

| JP | A-6-95369 | 4/1994 |
| JP | A-11-54270 | 2/1999 |
| JP | A-2000-187111 | 7/2000 |
| JP | A-2000-353594 | 12/2000 |
| JP | A-2001-27804 | 1/2001 |
| JP | A-2009-98673 | 5/2009 |
| JP | A-2009-288343 | 12/2009 |
| WO | WO 2007/132892 A1 | 11/2007 |
| WO | WO 2008/090827 A1 | 7/2008 |

OTHER PUBLICATIONS

International Search Report issued in International Patent Application No. PCT/JP2011/052046 dated Mar. 1, 2011.
Written Opinion issued in International Patent Application No. PCT/JP2011/052046 dated Mar. 1, 2011.
International Preliminary Report on Patentability issued in International Patent Application No. PCT/JP2011/052046 dated Sep. 18, 2012.

\* cited by examiner

*Primary Examiner* — Cynthia Hamilton
(74) *Attorney, Agent, or Firm* — Oliff PLC

(57) ABSTRACT

A positive photosensitive resin composition that forms an image for a liquid crystal display device and an organic EL display device, for example. The resin is made of a cured film that is highly water repellent and highly oleophobic on the surface. The resin has insulating properties, retains an excellent image and causes no reflow, for example, when being cured to form a film having excellent reworkability. A positive photosensitive resin composition comprising component (A), component (B), component (C) and component (D); Component (A) is an acrylic polymer containing an acid dissociable group, an aliphatic hydroxy group, and an N-substituted maleimide group; Component (B) is an acrylic polymer containing an acid dissociable group and a blocked isocyanate group; Component (C) is an acrylic polymer containing an acid dissociable group, an aliphatic hydroxy group, a $C_{3-10}$ fluoroalkyl group, and a silyl ether group, and Component (D) is a photoacid generator.

14 Claims, No Drawings

POSITIVE PHOTOSENSITIVE RESIN COMPOSITION AND LYOPHOBIC FILM

TECHNICAL FIELD

The present invention relates to a positive photosensitive resin composition and a cured film obtained from the same.

More specifically, the present invention relates to a positive photosensitive resin composition capable of forming an image in which the surface of a cured film is highly water repellent and oleophobic, the cured film thereof, and various materials containing the cured film. The positive photosensitive resin composition is particularly suitable to be used in an interlayer insulating film in a liquid crystal display and an EL display, and to be used as a light-shielding material and a partition material applicable to ink-jet printing.

BACKGROUND ART

Display devices such as a thin film transistor (TFT) liquid crystal display device and an organic electroluminescent (EL) element generally include an electrode protective film, a planarization film, an insulating film, and the like that are patterned. As a material to form these films, a photosensitive resin composition that gives a required pattern profile in fewer steps and achieves adequate flatness is conventionally and widely used instead of other photosensitive resin compositions.

As for fabrication of a display device, studies have been actively conducted in recent years on techniques of employing ink-jet printing to fabricate a substrate for full-color display. As for fabrication of a color filter for a liquid crystal display device, for example, suggestions have been made on a color filter obtained by, instead of employing conventional printing, electrodeposition, dyeing, or pigment dispersion, forming a patterned compartment (hereinafter, called a bank) for defining pixels with a light-shielding photosensitive resin layer, and then supplying ink dropwise into an opening surrounded by the bank, a method for fabricating the same (see Patent Document 1, for example), and the like. As for an organic EL display device, a method for fabricating an organic EL display device by forming a bank first and then supplying ink dropwise to form a light-emitting layer has been suggested (see Patent Document 2, for example).

In the case where ink-jet printing is employed to supply ink dropwise into an opening surrounded by a bank, the substrate must have an affinity with ink (hydrophilicity) and the bank must be water repellent on the surface thereof in order to prevent ink droplets from overflowing the bank into an adjacent pixel.

In order to achieve these objects, continuous plasma (ozone) treatment such as oxygen gas plasma treatment and fluorine gas plasma treatment has been suggested to give hydrophilicity to a substrate and water repellency to a bank (see Patent Document 3, for example). These processes of treatment are, however, complicated in the steps. Formulating a fluorine surfactant or a fluoropolymer in a photosensitive organic thin film has also been suggested (see Patent Document 4, for example), which is, however, impractical because this has many things to be considered including not only photosensitivity but also coating film properties such as the compatibility and the addition amount, and because the surface water repellency deteriorates due to UV/ozone treatment during hydrophilization treatment of the substrate.

RELATED ART DOCUMENTS

Patent Documents

Patent Document 1: Japanese Patent Application Publication No. JP-A-2000-187111
Patent Document 2: Japanese Patent Application Publication No. JP-A-11-54270
Patent Document 3: Japanese Patent Application Publication No. JP-A-2000-353594
Patent Document 4: Japanese Patent Application Publication No. JP-A-10-197715

SUMMARY OF THE INVENTION

Problem to be Solved by the Invention

The present invention is devised based on the above circumstances, and an object of the present invention is to form an image, for use in a liquid crystal display device, an organic EL display device, and the like, made of a cured film that is highly water repellent and highly oleophobic on the surface even after treated with plasma or the like and has insulating properties, and particularly in fabrication of a substrate by ink-jet printing, to form an image that is made of a cured film and can prevent ink droplets from overflowing a bank into an adjacent pixel.

In recent years, cost efficiency is very important in the process of manufacturing a TFT liquid crystal display device and an organic EL element, and therefore recycling of the substrate is demanded. That is, when inspection is performed on the pattern of a patterned film formed from a photosensitive resin composition and a defect is found, reworking steps of removing the patterned film from a substrate so as to recover the substrate are needed to be easily performed. However, a conventional cured film obtained from a positive photosensitive resin composition is rather intended to be made insoluble in an organic solvent or the like after post-baking so as to reduce film loss. Meanwhile, applying the structure of a negative photosensitive resin composition, the reworkability of which has been studied, directly to the structure of a positive photosensitive resin composition does not always fulfill the demand. Thus, actual evaluation is needed to be performed on the reworkability of a positive photosensitive resin composition so as to determine the optimum structure of the composition.

The present invention is devised based on the above circumstances, and an object of the present invention is to provide a positive photosensitive resin composition that retains an excellent image and causes no reflow or the like when being cured to form a film and the cured film of which has excellent reworkability.

Means for Solving the Problem

The inventors of the present invention have conducted intensive research to achieve the objects and, as a result, found that water repellency and lyophobicity can be efficiently provided to the surface of a cured film by forming the cured film from a composition that includes an acrylic polymer containing a fluoroalkyl group and a silyl ether group, and excellent reworkability can be provided by introducing, into the acrylic polymer, a group that dissociates by the action of an acid. Thus, the inventors have completed the present invention.

That is, the present invention provides:

as a first aspect, a positive photosensitive resin composition including a component (A), a component (B), a component (C), and a component (D):

Component (A): an acrylic polymer containing an acid dissociable group, an aliphatic hydroxy group, and an N-substituted maleimide group, Component (B): an acrylic polymer containing an acid dissociable group and a blocked isocyanate group, Component (C): an acrylic polymer containing an acid dissociable group, an aliphatic hydroxy group, a $C_{3-10}$ fluoroalkyl group, and a silyl ether group, and Component (D): a photoacid generator.

As a second aspect, in the positive photosensitive resin composition according to the first aspect, the acid dissociable groups in the component (A), the component (B), and the component (C) are independently a $C_{2-11}$ alkoxyalkyl group.

As a third aspect, in the positive photosensitive resin composition according to the first aspect or the second aspect, the component (A) is the acrylic polymer containing the acid dissociable group, the aliphatic hydroxy group, and the N-substituted maleimide group in a molar ratio of 5 to 50:5 to 50:20 to 70.

As a fourth aspect, in the positive photosensitive resin composition according to any one of the first aspect to the third aspect, the component (B) is the acrylic polymer containing the acid dissociable group and the blocked isocyanate group in a molar ratio of 5 to 50:15 to 80.

As a fifth aspect, in the positive photosensitive resin composition according to any one of the first aspect to the fourth aspect, the component (C) is the acrylic polymer containing the acid dissociable group, the aliphatic hydroxy group, the $C_{3-10}$ fluoroalkyl group, and the silyl ether group in a molar ratio of 5 to 40:5 to 50:5 to 50:10 to 60.

As a sixth aspect, the positive photosensitive resin composition according to any one of the first aspect to the fifth aspect includes 5 to 50 parts by mass of the component (B), 0.5 to 30 parts by mass of the component (C), and 0.1 to 20 parts by mass of the component (D), relative to 100 parts by mass of the component (A).

As a seventh aspect, the positive photosensitive resin composition according to any one of the first aspect to the sixth aspect also includes 0.05 to 10 parts by mass of a siloxane compound as a component (E) relative to 100 parts by mass of the component (A).

As an eighth aspect, the positive photosensitive resin composition according to any one of the first aspect to the seventh aspect also includes 0.5 to 10 parts by mass of a compound containing two or more vinyl ether groups per molecule as a component (F) relative to 100 parts by mass of the component (A).

As a ninth aspect, the positive photosensitive resin composition according to any one of the first aspect to the eighth aspect includes acrylic polymers as the component (A), the component (B), and the component (C):

Component (A): an acrylic polymer obtained by polymerizing a monomer mixture that contains a monomer having an acid dissociable group, a monomer having an aliphatic hydroxy group, and an N-substituted maleimide monomer, Component (B): an acrylic polymer obtained by polymerizing a monomer mixture that contains a monomer having an acid dissociable group and a monomer having a blocked isocyanate group, and Component (C): an acrylic polymer obtained by polymerizing a monomer mixture that contains a monomer having an acid dissociable group, a monomer having an aliphatic hydroxy group, a monomer having a $C_{3-10}$ fluoroalkyl group, and a monomer having a silyl ether group.

The present invention provides:

as a tenth aspect, a cured film that is produced by curing the positive photosensitive resin composition as described in any one of the first aspect to the ninth aspect.

The present invention provides:

as an eleventh aspect, a display device including the cured film as described in the tenth aspect.

The present invention provides:

as a twelfth aspect, an organic EL element including the cured film as described in the tenth aspect.

The present invention provides:

as a thirteenth aspect, a method for forming an image by applying a photosensitive resin composition to a base material to form a film, and then performing exposure and development, in which the resin composition is the positive photosensitive resin composition as described in any one of the first aspect to the ninth aspect, the method including a step for post-exposure baking (PEB) at a temperature of 50 to 150° C. after exposure and before development.

As a fourteenth aspect, the method for forming an image according to the thirteenth aspect also includes a step for heating (post-baking) at a temperature of 130 to 250° C. after development.

Effects of the Invention

The positive photosensitive resin composition of the present invention is suitable as a material for forming a patterned insulating film used in a liquid crystal display device, an organic EL display device, or the like, and as a material of a partition between pixels, forms an image having excellent reworkability, can retain an excellent image after curing, and can retain high water repellency and high oleophobicity after treated with oxygen plasma (ozone) or the like.

A cured film obtained from the positive photosensitive resin composition of the present invention, when fabricated by ink-jet printing into a substrate, can prevent ink droplets from overflowing a bank into an adjacent pixel. A cured film obtained from the positive photosensitive resin composition of the present invention can also be made into various elements/devices and materials.

MODES FOR CARRYING OUT THE INVENTION

The positive photosensitive resin composition of the present invention includes acrylic polymers as components (A) to (C), a photoacid generator as a component (D), and, as desired, a siloxane compound as a component (E) and a compound containing two or more vinyl ether groups per molecule as a component (F).

The composition of the present invention including the acrylic polymer as the component (C) can form a film in which a $C_{3-10}$ fluoroalkyl group and a silyl ether group are unevenly distributed in the vicinity of the surface, and therefore can efficiently provide water repellency and lyophobicity to the surface of the film.

The composition of the present invention including the acrylic polymers as the components (A) to (C) can achieve excellent reworkability and, when cured, can retain an excellent image without causing reflow.

Each of the components will be explained in detail.

[Component (A)]

The component (A) is an acrylic polymer containing an acid dissociable group, an aliphatic hydroxy group, and an N-substituted maleimide group.

The acid dissociable group refers to a group that dissociates from the acrylic polymer by the action of an acid generated by a photoacid generator described below. The acid dissociable group is, for example, an alkoxyalkyl group, a t-alkyl group, a bridged cyclic hydrocarbon group, or an alkoxycarbonyl group each of which preferably has 1 to 12 carbon atoms.

The alkyl group in the alkoxyalkyl group preferably has 1 to 5 carbon atoms and more preferably has 1 to 3 carbon atoms. The alkoxy group in the alkoxyalkyl group preferably has 1 to 6 carbon atoms. Examples of the alkoxyalkyl group include a methoxymethyl group, a methoxyethyl group, an ethoxyethyl group, a propoxyethyl group, an isopropoxyethyl group, an isopropoxyethyl group, a butoxyethyl group, an isobutoxyethyl group, a t-butoxyethyl group, and a cyclohexyloxyethyl group.

Examples of the t-alkyl group include a tert-butyl group, a t-amyl group, and the like.

Examples of the bridged cyclic hydrocarbon group include a norbornenyl group, a 2-methyladamantyl group, a 1-methyladamantyl group, and the like.

Examples of the alkoxycarbonyl group include a t-butoxycarbonyl group and the like.

Examples of the aliphatic hydroxy group include hydroxyalkyl groups, preferably $C_{2-10}$ hydroxyalkyl groups, and more preferably $C_{2-10}$ hydroxyalkyl groups.

The N-substituted maleimide group is a group in which the N atom of a maleimide group is substituted with an organic group. Examples of the substituent for the N atom include alicyclic groups, alkyl groups, and a phenyl group, and specific examples thereof include a cyclohexyl group, $C_{1-5}$ alkyl groups, and a phenyl group. A preferable substituent for the N atom is an alicyclic group or an alkyl group.

In the acrylic polymer as the component (A), the molar ratio of acid dissociable group:aliphatic hydroxy group:N-substituted maleimide group is preferably 5 to 50:5 to 50:20 to 70 and is more preferably 10 to 40:10 to 40:30 to 60.

The number average molecular weight of the acrylic polymer as the component (A) is preferably 1,500 to 20,000.

The acrylic polymer (hereinafter, also simply called as an acryl A) as the component (A) can be produced by a polymerization reaction of a monomer having an acid dissociable group, a monomer having an aliphatic hydroxy group, an N-substituted maleimide monomer, and, as desired, a monomer other than these (hereinafter, also called another monomer A), in a solvent in the presence of a polymerization initiator at a temperature of 50 to 110° C.

The acryl A thus obtained is usually a solution in which the acryl A is dissolved in a solvent, and can be used as in this state (without isolation) in the positive photosensitive resin composition of the present invention.

The acryl A solution thus obtained is added to diethyl ether, water, or the like with stirring for reprecipitation, and the resulting precipitate is then subjected to filtration, washing, and drying at normal pressure or under reduced pressure at normal temperature or with heating, whereby an acryl A powder can be obtained. This process can remove a polymerization initiator and an unreacted monomer coexisting with the acryl A to obtain a purified acryl A powder. When the product is not adequately purified by performing this process once, the resulting powder may be redissolved in a solvent to repeat the process.

In the present invention, the acryl A powder may be used as it is, or as a solution obtained by redissolving the powder in, for example, a solvent described below.

Examples of the monomer having a dissociative group include 1-methoxyethyl methacrylate, 1-methoxyethyl acrylate, 1-ethoxyethyl methacrylate, 1-ethoxyethyl acrylate, 1-propoxyethyl methacrylate, 1-propoxyethyl acrylate, 1-isopropoxyethyl methacrylate, 1-isopropoxyethyl acrylate, 1-butoxyethyl methacrylate, 1-butoxyethyl acrylate, 1-isobutoxyethyl methacrylate, 1-isobutoxyethyl acrylate, 1-t-butoxyethyl methacrylate, 1-t-butoxyethyl acrylate, 1-cyclohexyloxyethyl methacrylate, 1-cyclohexyloxyethyl acrylate, methoxymethyl methacrylate, methoxymethyl acrylate, ethoxymethyl methacrylate, ethoxymethyl acrylate, propoxymethyl methacrylate, propoxymethyl acrylate, isopropoxymethyl methacrylate, isopropoxymethyl acrylate, butoxymethyl methacrylate, butoxymethyl acrylate, isobutoxymethyl methacrylate, isobutoxymethyl acrylate, t-butoxymethyl methacrylate, t-butoxymethyl acrylate, cyclohexyloxymethyl methacrylate, cyclohexyloxymethyl acrylate, t-butyl acrylate, t-butyl methacrylate, t-amyl acrylate, t-amyl methacrylate, norbornenyl acrylate, norbornenyl methacrylate, 1-methyladamantyl acrylate, 2-methyladamantyl acrylate, 2-methyl-2-adamantyl acrylate, 2-methyl-2-adamantyl methacrylate, p-t-butoxycarbonyloxystyrene, and the like.

Examples of the monomer having an aliphatic hydroxy group include 2-hydroxyethyl acrylate, 2-hydroxyethyl methacrylate, 2-hydroxypropyl acrylate, 2-hydroxypropyl methacrylate, 4-hydroxybutyl acrylate, 4-hydroxybutyl methacrylate, glycerol methacrylate, and the like.

Examples of the N-substituted maleimide monomer include N-ethylmaleimide, N-methylmaleimide, N-phenylmaleimide, N-benzylmaleimide, N-cyclohexylmaleimide, and the like.

Examples of the another monomer A include methacrylic acid, methyl methacrylate, ethyl methacrylate, isopropyl methacrylate, benzyl methacrylate, naphthyl methacrylate, anthryl methacrylate, anthrylmethyl methacrylate, phenyl methacrylate, glycidyl methacrylate, cyclohexyl methacrylate, isobornyl methacrylate, methoxytriethylene glycol methacrylate, 2-ethoxyethyl methacrylate, 2-aminomethyl methacrylate, tetrahydrofurfuryl methacrylate, 3-methoxybutyl methacrylate, γ-butyrolactone methacrylate, 2-propyl-2-adamantyl methacrylate, 8-methyl-8-tricyclodecyl methacrylate, 8-ethyl-8-tricyclodecyl methacrylate, acrylic acid, methyl acrylate, ethyl acrylate, isopropyl acrylate, benzyl acrylate, naphthyl acrylate, anthryl acrylate, anthrylmethyl acrylate, phenyl acrylate, glycidyl acrylate, cyclohexyl acrylate, isobornyl acrylate, methoxytriethylene glycol acrylate, 2-ethoxyethyl acrylate, 2-aminomethyl acrylate, tetrahydrofurfuryl acrylate, 3-methoxybutyl acrylate, γ-butyrolactone acrylate, 2-propyl-2-adamantyl acrylate, 8-methyl-8-tricyclodecyl acrylate, 8-ethyl-8-tricyclodecyl acrylate, styrene, vinylnaphthalene, vinylanthracene, vinylbiphenyl, vinylbenzoic acid, hydroxystyrene, and the like.

Examples of the polymerization initiator include α,α'-azobisisobutyronitrile, 2,2'-azobis(4-methoxy-2,4-dimethylvaleronitrile), 2,2'-azobis(2,4-dimethylvaleronitrile), dimethyl-2,2'-azobis(2-methylpropionate), 2,2'-azobis(2-methylbutyronitrile), 1,1'-azobis(cyclohexane-1-carbonitrile), 2,2'-azobis[N-(2-propenyl)-2-methylpropionamide], 1-(1-cyano-1-methylethylazo) formamide, 2,2'-azobis(N-butyl-2-methylpropionamide), 2,2'-azobis(N-cyclohexyl-2-methylpropionamide), di-o-methylbenzoyl peroxide, di-p-methylbenzoyl peroxide, dicumyl peroxide, 2,5-dimethyl-2,5-di(t-butylperoxy) hexane, t-butylcumyl peroxide, and the like.

The solvent (hereinafter, also called a polymerization solvent) that is used in producing the acryl A is not particularly limited provided that it dissolves the acryl A and each monomer that composes the acryl A. Examples thereof include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, 2-heptanone, γ-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methyl-2-pyrrolidone, and the like.

These solvents can be used alone or as a combination of two or more of these.

[Component (B)]

The component (B) is an acrylic polymer containing an acid dissociable group and a blocked isocyanate group.

Examples of the acid dissociable group can include the same acid dissociable groups exemplified above for the component (A).

The blocked isocyanate group refers to a group in which an isocyanate group (—NCO) is blocked by an appropriate protecting group, namely, a group obtained by subjecting an isocyanate group to a reaction with a blocking agent.

The protecting group (blocking part) is released at high temperatures by thermal dissociation to generate an isocyanate group. The protecting group preferably dissociates from an isocyanate group at not lower than 140° C.

Specific examples of the blocking agent include oximes such as methyl ethyl ketone oxime, methyl isobutyl ketone oxime, cyclohexanone oxime, diisobutyl ketone oxime, acetone oxime, butanal oxime, and acetaldehyde oxime, lactams such as ε-caprolactam and heptanolactam, phenols such as phenol and cresol, pyrazoles such as pyrazole, 3,5-dimethylpyrazole, and 3-methylpyrazole, and the like.

In the acrylic polymer as the component (B), the molar ratio of acid dissociable group:blocked isocyanate group is preferably 5 to 50:15 to 80.

The number average molecular weight of the acrylic polymer as the component (B) is preferably 2,000 to 30,000.

The acrylic polymer (hereinafter, also simply called as an acryl B) as the component (B) can be produced in the same manner as in the case of the acrylic polymer as the component (A), namely, by a polymerization reaction of a monomer having an acid dissociable group, a monomer having a blocked isocyanate group, and, as desired, a monomer other than these (hereinafter, also called another monomer B), in a solvent in the presence of a polymerization initiator at a temperature of 50 to 110° C.

The acryl B thus obtained is usually a solution in which the acryl B is dissolved in a solvent, and can be used as in this state (without isolation) in the positive photosensitive resin composition of the present invention.

In the same manner as in the case of the acryl A solution, the acryl B solution thus obtained is subjected to reprecipitation, the resulting precipitate is then subjected to filtration, washing, and drying at normal pressure or under reduced pressure at normal temperature or with heating, and, where appropriate, these steps are repeated, whereby a polymerization initiator and an unreacted monomer coexisting with the acryl B can be removed to obtain a purified acryl B powder.

In the present invention, in the same manner as in the case of the acryl A powder, the acryl B powder may be used as it is, or as a solution obtained by redissolving the powder in a solvent described below.

The monomer having an acid dissociable group, the polymerization initiator, and the solvent that can be used in producing the acryl B are the same ones as these used in producing the acryl A.

The another monomer B that can be used is the same one as the monomer having an aliphatic hydroxy group and the another monomer A used in producing the acryl A.

Specific examples of the monomer having a blocked isocyanate group include monomers in which a blocking agent such as methyl ethyl ketone oxime, methyl isobutyl ketone oxime, cyclohexanone oxime, diisobutyl ketone oxime, acetone oxime, butanal oxime, acetaldehyde oxime, ε-caprolactam, heptanolactam, phenols such as phenol and cresol, pyrazole, 3,5-dimethylpyrazole, and 3-methylpyrazole is added to an isocyanate-containing monomer such as isocyanate ethyl methacrylate, isocyanate ethyl acrylate, and m-tetramethylstyrene isocyanate.

[Component (C)]

The component (C) is an acrylic polymer containing an acid dissociable group, an aliphatic hydroxy group, a $C_{3-10}$ fluoroalkyl group, and a silyl ether group.

Examples of the acid dissociable group and the aliphatic hydroxy group can include the same acid dissociable groups and the same aliphatic hydroxy groups exemplified above for the component (A).

The fluoroalkyl group has 3 to 10 carbon atoms, and is preferably a $C_{4-10}$ fluoroalkyl group.

Examples of the fluoroalkyl group include a 2,2,2-trifluoroethyl group, a 2,2,3,3,3-pentafluoropropyl group, a 2-(perfluorobutyl)ethyl group, a 3-perfluorobutyl-2-hydroxypropyl group, a 2-(perfluorohexyl)ethyl group, a 3-perfluorohexyl-2-hydroxypropyl group, a 2-(perfluorooctyl)ethyl group, a 3-perfluorooctyl-2-hydroxypropyl group, a 2-(perfluorodecyl)ethyl group, a 2-(perfluoro-3-methylbutyl)ethyl group, a 3-(perfluoro-3-methylbutyl)-2-hydroxypropyl group, a 2-(perfluoro-5-methylhexyl)ethyl group, a 2-(perfluoro-5-methylhexyl)-2-hydroxypropyl group, a 2-(perfluoro-7-methyloctyl)ethyl group, a 2-(perfluoro-7-methyloctyl)-2-hydroxypropyl group, and the like.

The silyl ether group refers to a group in which the hydroxy group of an alcohol is protected by a trialkylsilyl group, and is preferably a group of Formula:

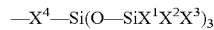

$$-X^4-Si(O-SiX^1X^2X^3)_3$$

(where $X^1$, $X^2$, and $X^3$ are independently a $C_{1-3}$ alkyl group, and $X^4$ is a $C_{1-6}$ alkylene group).

In the acrylic polymer as the component (C), the molar ratio of acid dissociable group:aliphatic hydroxy group:fluoroalkyl group:silyl ether group is preferably 5 to 40:5 to 50:5 to 50:10 to 60.

The number average molecular weight of the acrylic polymer as the component (C) is preferably 2,000 to 30,000.

The acrylic polymer (hereinafter, also simply called as an acryl C) as the component (C) can be produced in the same manner as in the case of the acrylic polymer as the component (A), namely, by a polymerization reaction of a monomer having an acid dissociable group, a monomer having an aliphatic hydroxy group, a monomer having a $C_{3-10}$ fluoroalkyl group, a monomer having a silyl ether group, and, as desired, a monomer other than these (hereinafter, also called another monomer C), in a solvent in the presence of a polymerization initiator at a temperature of 50 to 110° C.

The acryl C thus obtained is usually a solution in which the acryl C is dissolved in a solvent, and can be used as in this state (without isolation) in the positive photosensitive resin composition of the present invention.

In the same manner as in the case of the acryl A solution, the acryl C solution thus obtained is subjected to reprecipitation, the resulting precipitate is then subjected to filtration, washing, and drying at normal pressure or under reduced pressure at normal temperature or with heating, and these steps are repeated, where appropriate, whereby a polymerization initiator and an unreacted monomer coexisting with the acryl C can be removed to obtain a purified acryl C powder.

In the present invention, in the same manner as in the case of the acryl A powder, the acryl C powder may be used as it is, or as a solution obtained by redissolving the powder in a solvent described below.

The monomer having an acid dissociable group, the monomer having an aliphatic hydroxy group, the polymerization initiator, and the solvent that can be used in producing the acryl C are the same ones as those used in producing the acryl A.

Specific examples of the monomer having a $C_{3-10}$ fluoroalkyl group include 2,2,2-trifluoroethyl acrylate, 2,2,2-trifluoroethyl methacrylate, 2,2,3,3,3-pentafluoropropyl acrylate, 2,2,3,3,3-pentafluoropropyl methacrylate, 2-(perfluorobutyl)ethyl acrylate, 2-(perfluorobutyl)ethyl methacrylate, 3-perfluorobutyl-2-hydroxypropyl acrylate, 3-perfluorobutyl-2-hydroxypropyl methacrylate, 2-(perfluorohexyl)ethyl acrylate, 2-(perfluorohexyl)ethyl methacrylate, 3-perfluorohexyl-2-hydroxypropyl acrylate, 3-perfluorohexyl-2-hydroxypropyl methacrylate, 2-(perfluorooctyl)ethyl acrylate, 2-(perfluorooctyl)ethyl methacrylate, 3-perfluorooctyl-2-hydroxypropyl acrylate, 3-perfluorooctyl-2-hydroxypropyl methacrylate, 2-(perfluorodecyl)ethyl acrylate, 2-(perfluorodecyl)ethyl methacrylate, 2-(perfluoro-3-methylbutyl)ethyl acrylate, 2-(perfluoro-3-methylbutyl)ethyl methacrylate, 3-(perfluoro-3-methylbutyl)-2-hydroxypropyl acrylate, 3-(perfluoro-3-methylbutyl)-2-hydroxypropyl methacrylate, 2-(perfluoro-5-methylhexyl)ethyl acrylate, 2-(perfluoro-5-methylhexyl)ethyl methacrylate, 2-(perfluoro-5-methylhexyl)-2-hydroxypropyl acrylate, 2-(perfluoro-5-methylhexyl)-2-hydroxypropyl methacrylate, 2-(perfluoro-7-methyloctyl)ethyl acrylate, 2-(perfluoro-7-methyloctyl)ethyl methacrylate, 2-(perfluoro-7-methyloctyl)-2-hydroxypropyl acrylate, 2-(perfluoro-7-methyloctyl)-2-hydroxypropyl methacrylate, and the like.

Examples of the monomer having a silyl ether group include methacryloxypropyl-tris(trimethylsiloxy)silane, methacryloxytrispropylsilane, 2-(methacryloxyethoxy)trimethylsilane, 2-(methacryloxyethyl)trimethylsilane, 2-(acryloxyethoxy)trimethylsilane, acryloxytrispropylsilane, 2-(acryloxyethyl)trimethylsilane, acryloxypropyl-tris(trimethylsiloxy)silane, and the like.

The another monomer C that can be used is the same one as the another monomer A used in producing the acryl A, and is preferably a monomer containing no alkali-soluble group (hydroxyphenyl group and carboxy group).

Specific examples of the another monomer C include methyl methacrylate, ethyl methacrylate, isopropyl methacrylate, benzyl methacrylate, naphthyl methacrylate, anthryl methacrylate, anthrylmethyl methacrylate, phenyl methacrylate, glycidyl methacrylate, cyclohexyl methacrylate, isobornyl methacrylate, methoxytriethylene glycol methacrylate, 2-ethoxyethyl methacrylate, 2-aminomethyl methacrylate, tetrahydrofurfuryl methacrylate, 3-methoxybutyl methacrylate, γ-butyrolactone methacrylate, 2-propyl-2-adamantyl methacrylate, 8-methyl-8-tricyclodecyl methacrylate, 8-ethyl-8-tricyclodecyl methacrylate, methyl acrylate, ethyl acrylate, isopropyl acrylate, benzyl acrylate, naphthyl acrylate, anthryl acrylate, anthrylmethyl acrylate, phenyl acrylate, glycidyl acrylate, cyclohexyl acrylate, isobornyl acrylate, methoxytriethylene glycol acrylate, 2-ethoxyethyl acrylate, 2-aminomethyl acrylate, tetrahydrofurfuryl acrylate, 3-methoxybutyl acrylate, γ-butyrolactone acrylate, 2-propyl-2-adamantyl acrylate, 8-methyl-8-tricyclodecyl acrylate, 8-ethyl-8-tricyclodecyl acrylate, styrene, vinylnaphthalene, vinylanthracene, vinylbiphenyl, and the like.

[Component (D)]

The component (D) is a photoacid generator (PAG), which is a substance that directly or indirectly generates an acid (a sulfonic acid, a carboxylic acid, or the like) when irradiated with light used in exposure. The types, the structure, and the like of the component (D) are not particularly limited provided that the component (D) has such a characteristic.

Examples of the photoacid generator as the component (D) include diazomethane compounds, onium salt compounds, sulfonimide compounds, disulfone compounds, sulfonic acid derivative compounds, nitrobenzyl compounds, benzoin tosylate compounds, iron-arene complexes, halogen-containing triazine compounds, acetophenone derivative compounds, cyano group-containing oxime sulfonate compounds, and the like. Any photoacid generator that is conventionally known or has been conventionally used can be used in the present invention with no particular limitation. In the present invention, the photoacid generator as the component (D) may be used alone or as a combination of two or more of these.

Specific examples of the photoacid generator include the following, which are merely examples of a large number of photoacid generators that can be used, and therefore are by no means limitative:

Formula (1)

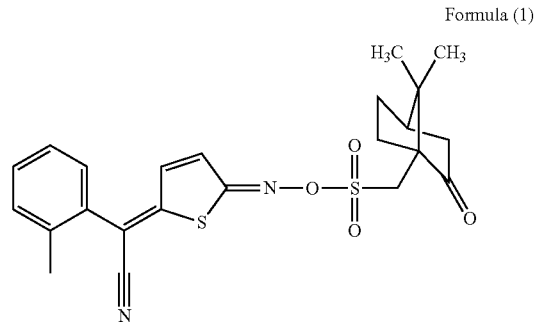

Formula (2)

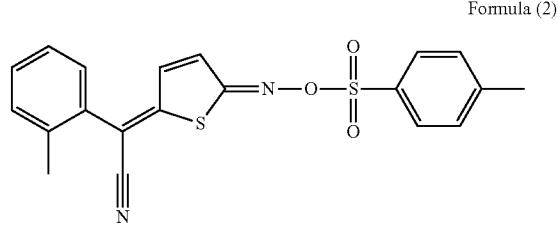

Formula (3)

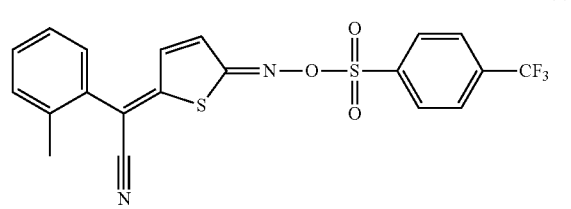

Formula (4)

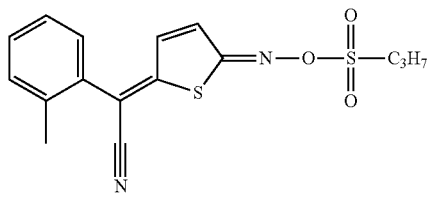

Formula (5)

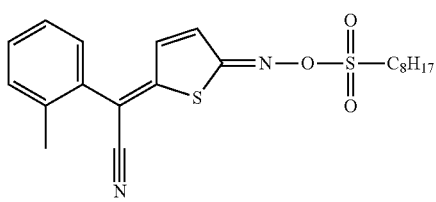

diphenyliodonium chloride, diphenyliodonium trifluoromethanesulfonate, diphenyliodonium mesylate, diphenyliodonium tosylate, diphenyliodonium bromide, diphenyliodonium tetrafluoroborate, diphenyliodonium hexafluoroantimonate, diphenyliodonium hexafluoroarsenate, bis(p-tert-butylphenyl)iodonium hexafluorophosphate, bis(p-tert-butylphenyl)iodonium mesylate, bis(p-tert-butylphenyl) iodonium tosylate, bis(p-tert-butylphenyl)iodonium trifluoromethanesulfonate, bis(p-tert-butylphenyl)iodonium tetrafluoroborate, bis(p-tert-butylphenyl)iodonium chloride, bis(p-chlorophenyl)iodonium chloride, bis(p-chlorophenyl)iodonium tetrafluoroborate, triphenylsulfonium chloride, triphenylsulfonium bromide, triphenylsulfonium trifluoromethanesulfonate, tri(p-methoxyphenyl)sulfonium tetrafluoroborate, tri(p-methoxyphenyl)sulfonium hexafluorophosphonate, tri(p-ethoxyphenyl)sulfonium tetrafluoroborate, triphenylphosphonium chloride, triphenylphosphonium bromide, tri(p-methoxyphenyl) phosphonium tetrafluoroborate, tri(p-methoxyphenyl) phosphonium hexafluorophosphonate, tri(p-ethoxyphenyl) phosphonium tetrafluoroborate, Formula (6)

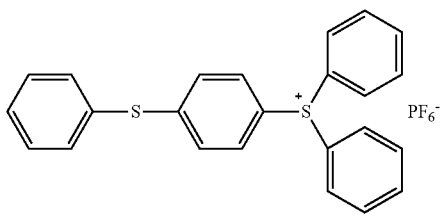

Formula (7)

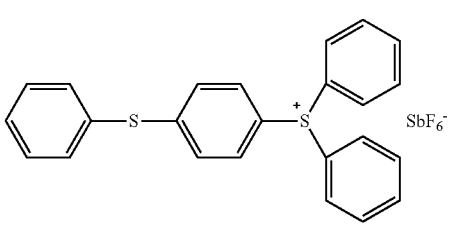

Formula (8)

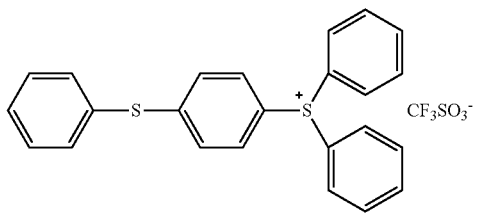

Formula (9)

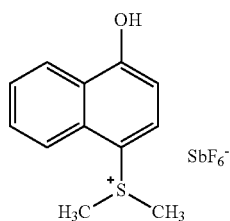

Formula (10)

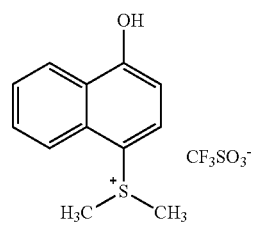

Formula (11)

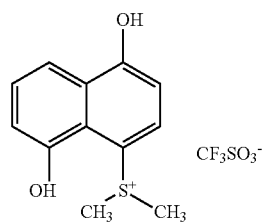

Formula (12)

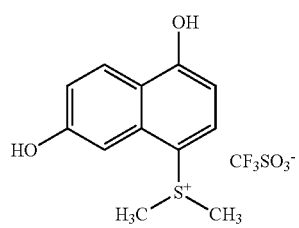

Formula (13)

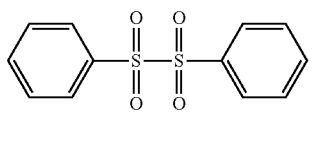

Formula (14)

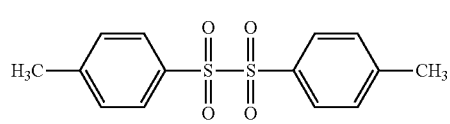

Formula (15)

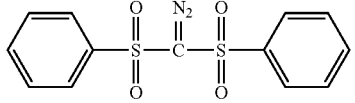

Formula (16)
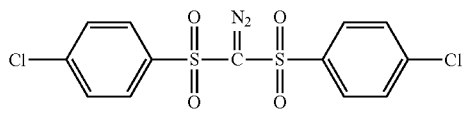
Formula (17)
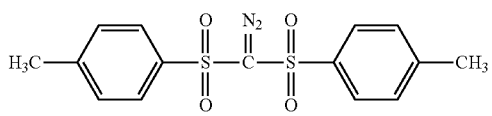
Formula (18)
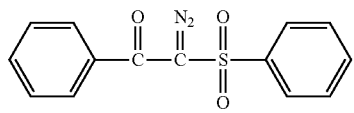
Formula (19)
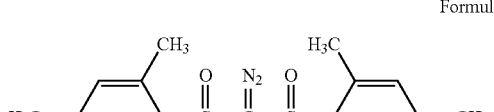
Formula (20)
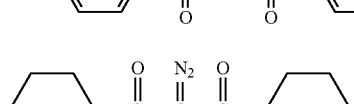
Formula (21)
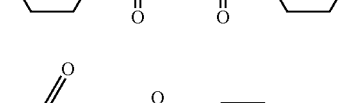
Formula (22)
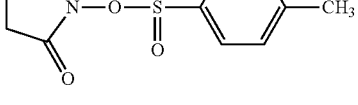
Formula (23)
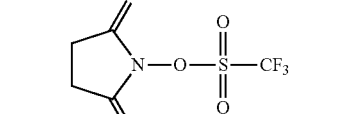
Formula (24)
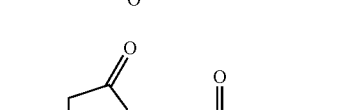
Formula (25)
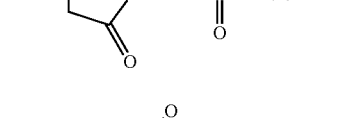
Formula (26)
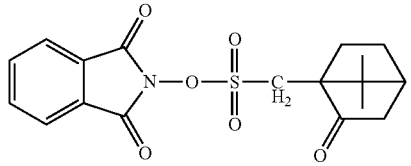
Formula (27)
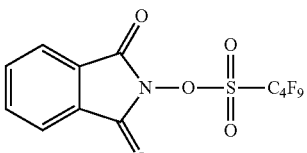
Formula (28)
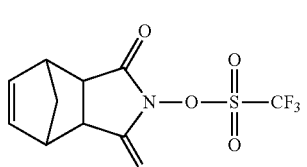
Formula (29)
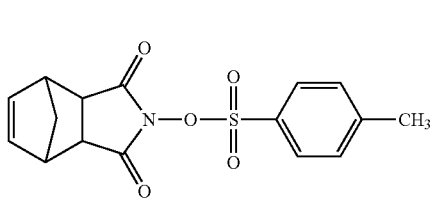
Formula (30)
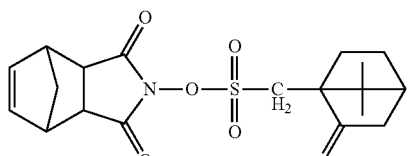
Formula (31)
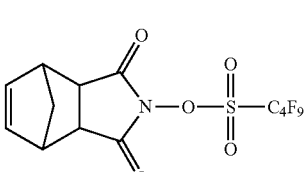
Formula (32)
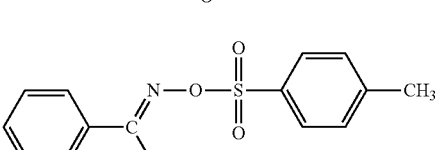
Formula (33)
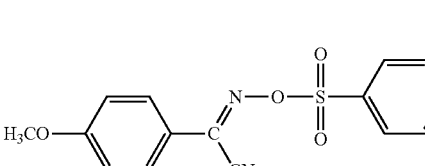
Formula (34)
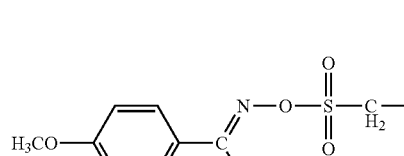

Formula (35)
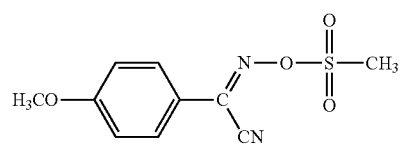
Formula (36)
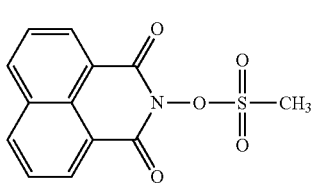
Formula (37)
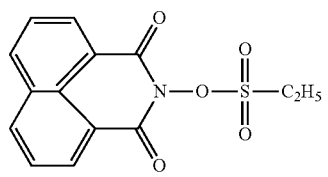
Formula (38)
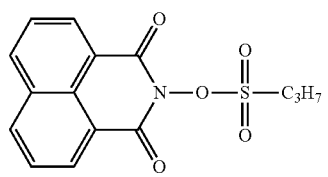
Formula (39)
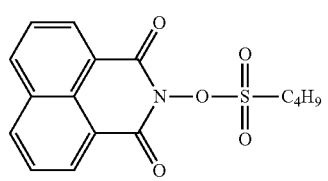
Formula (40)
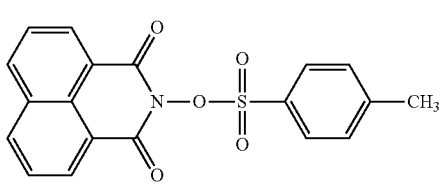
Formula (41)
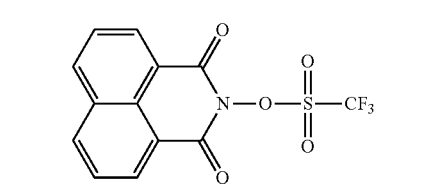
Formula (42)
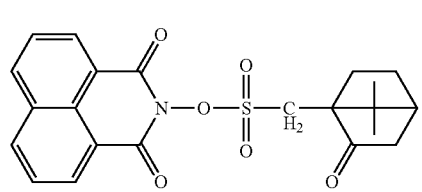
Formula (43)
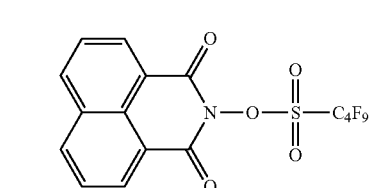
Formula (44)
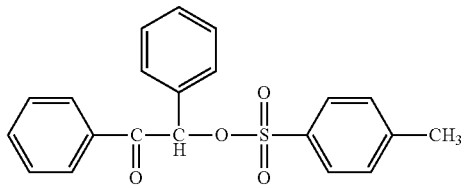
Formula (45)
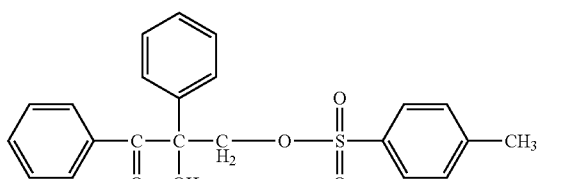
Formula (46)
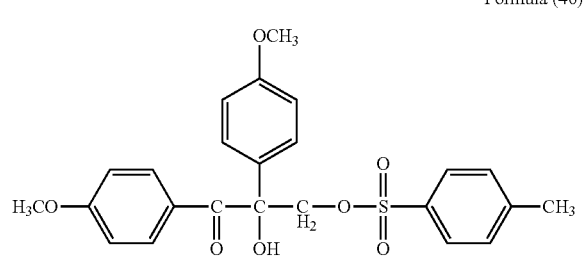
Formula (47)
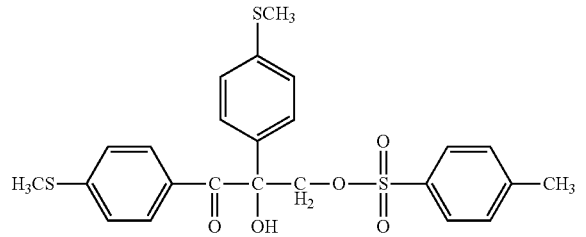
Formula (48)
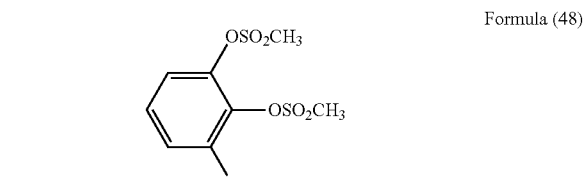
Formula (49)
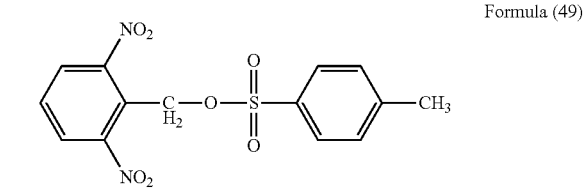
Formula (50)
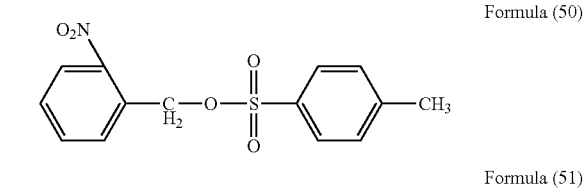
Formula (51)

-continued
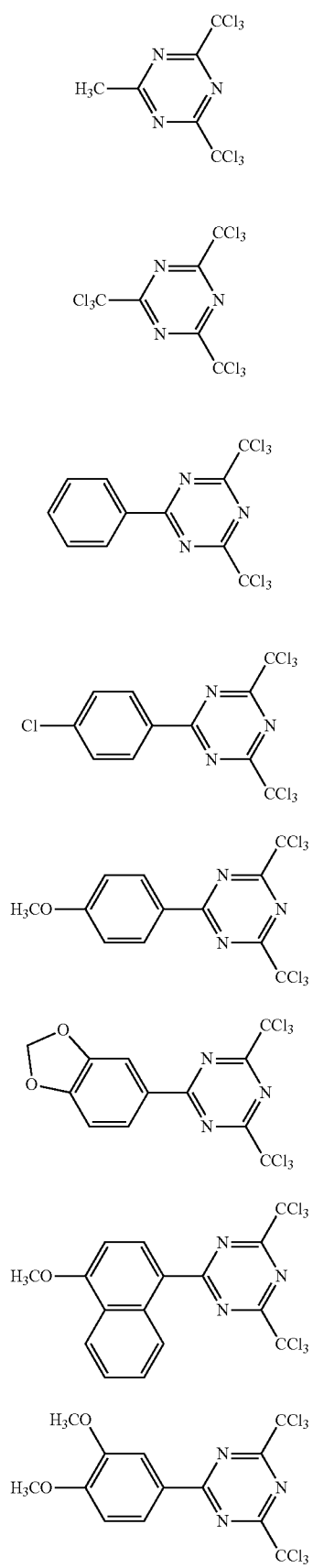
Formula (52)
Formula (53)
Formula (54)
Formula (55)
Formula (56)
Formula (57)
Formula (58)
Formula (59)
-continued
Formula (60)
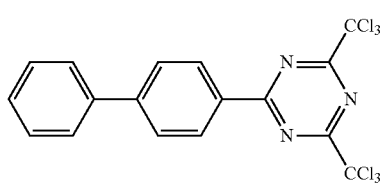
Formula (61)
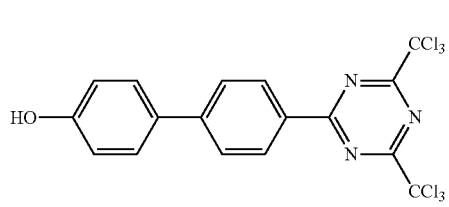
Formula (62)
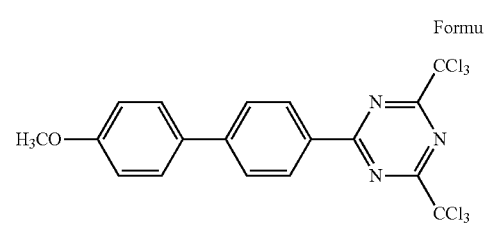
Formula (63)
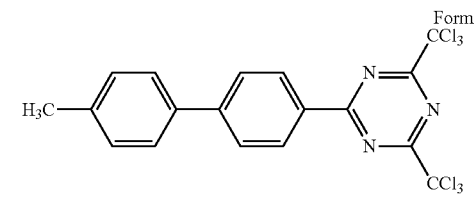
Formula (64)
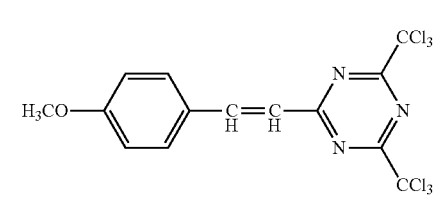
Formula (65)
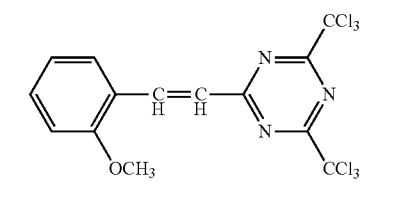
Formula (66)
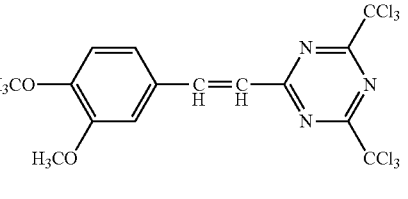
Formula (67)
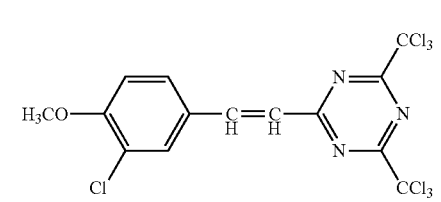

-continued

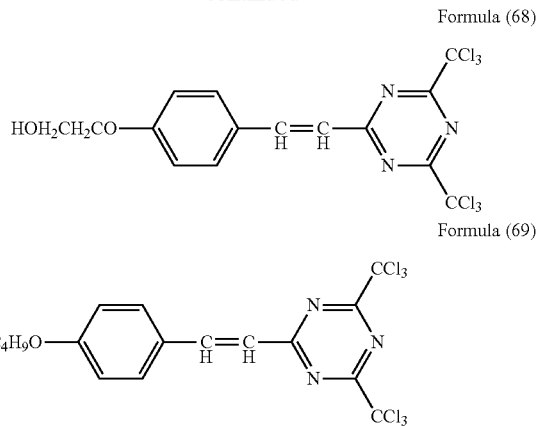

Among these photoacid generators, a compound that generates a strong acid by light is preferably used, and a compound that generates a sulfonic acid or hydrochloric acid is particularly preferably used.

[Component (E)]

In the present invention, a siloxane compound may be used as the component (E). The siloxane compound as the component (E) preferably has a characteristic to exude from the surface of a pattern during a series of heat treatment steps performed in the course of forming a cured film (patterned film) from the positive photosensitive resin composition of the present invention, that is, heat treatment for a crosslinking reaction between the acrylic polymer as the component (A) and the acrylic polymer as the component (C), heat treatment after exposure, and heat treatment for a crosslinking reaction with the component (B).

The component (E) is specifically a siloxane compound having a number average molecular weight of 100 to 2,000. The siloxane compound herein refers to an organosiloxane compound, an organosiloxane compound that is partly substituted with a hydrogen atom or a hydroxy group, and a modified product thereof.

Examples of the siloxane compound include linear siloxane compounds, siloxane compounds having a branched structure, cyclic siloxane compounds, and copolymers of these. Examples thereof can also include the above siloxane compounds being modified with a non-reactive group, such as alkoxy-modified siloxane compounds, polyether-modified siloxane compounds, fluorine-modified siloxane compounds, methylstyryl-modified siloxane compounds, higher fatty acid ester-modified siloxane compounds, specially hydrophilically modified siloxane compounds, and higher alkoxy-modified siloxane compounds of the above siloxane compounds, the above siloxane compounds being modified with a reactive group, such as amino-modified siloxane compounds, epoxy-modified siloxane compounds, carboxy-modified siloxane compounds, carbinol-modified siloxane compounds, methacryl-modified siloxane compounds, mercapto-modified siloxane compounds, and phenol-modified siloxane compounds of the above siloxane compounds, and the like.

Specific examples thereof include linear siloxanes or copolymers thereof such as polydimethylsiloxane, polymethylethylsiloxane, polymethylphenylsiloxane, polymethylhydroxysiloxane, polymethylpropylsiloxane, polydiphenylsiloxane, and polymethylbutylsiloxane, cyclic siloxanes such as cyclic polydimethylsiloxane, cyclic polymethylphenylsiloxane, cyclic polymethylhydroxysiloxane, cyclic polymethylethylsiloxane, cyclic polymethylpropylsiloxane, and cyclic polymethylbutylsiloxane, non-reactive group-modified siloxanes such as alkoxy-modified siloxanes, polyether-modified siloxanes, fluorine-modified siloxanes, methylstyryl-modified siloxanes, higher fatty acid ester-modified siloxanes, specially hydrophilically modified siloxanes, and higher alkoxy-modified siloxanes, reactive group-modified siloxanes such as amino-modified siloxanes, epoxy-modified siloxanes, carboxy-modified siloxanes, carbinol-modified siloxanes, methacryl-modified siloxanes, mercapto-modified siloxanes, and phenol-modified siloxanes, copolymer of these, and the like.

These siloxane compounds are easily available as a commercially available product, and specific examples thereof include linear siloxane compounds such as L-45 (manufactured by Nippon Unicar Company Limited), SH200, 510, 550, 710, 705, and 1107 (manufactured by Dow Corning Toray Co., Ltd.), X-22-162C, 3701E, 3710, 1821, 164S, 170DX, 176DX, 164A, 4952, KF96, 50, 54, 99, 351, 618, 910, 700, 6001, 6002, 8010, KR271, and 282 (manufactured by Shin-Etsu Chemical Co., Ltd.), cyclic siloxane compounds such as VS-7158 (manufactured by Nippon Unicar Company Limited) and BY11-003 (manufactured by Dow Corning Toray Co., Ltd.), modified siloxane compounds such as L-77, 720, 7001, 7604, Y-7006, L-9300, FZ-2101, 2110, 2130, 2161, 3704, 3711, 3722, 3703, 3720, 3736, 3705, and 3760 (manufactured by Nippon Unicar Company Limited), SF8427, 8428, 8413, 8417, SH193, 194, 190, 192, 556, 3746, 3749, 3771, 8400, SRX280A, BY16-036, -848, -828, -853B, -855B, -839, -845, -752, -750, -838, -150B, BX16-854, -866, SF8421EG, SH28PA, SH30PA, ST89PA, and ST103PA (manufactured by Dow Corning Toray Co., Ltd.), ES1001N, 1023, X-22-161, -163, -169, -162, -164, KF-860, -101, -102, -6001, -6011, -6015, -8001, -351, -412, -910, -905, X-22-2426, X-22-174DX, and X-24-8201 (manufactured by Shin-Etsu Chemical Co., Ltd.), fluorine-modified siloxane compounds such as FS1265 (manufactured by Dow Corning Toray Co., Ltd.), FL-5, FL-10, X-22-820, X-22-821, X-22-822, and FL100 (manufactured by Shin-Etsu Chemical Co., Ltd.), copolymers of a polysiloxane and a polyalkylene oxide such as FZ-2203, 2207, and 2222 (manufactured by Nippon Unicar Company Limited), and the like.

Particularly preferable among these siloxane compounds is a siloxane compound having a repeating unit with a structure of Formula (70):

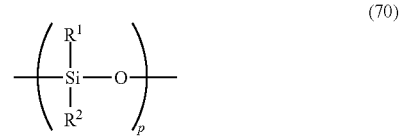

(where $R^1$ and $R^2$ are independently a hydrogen atom, an alkyl group, or a phenyl group, and p is a positive integer).

In the present invention, the siloxane compound having a repeating unit with a structure of Formula (70) may be modified or unmodified.

The siloxane compound preferably has no epoxy group because, in the case where the siloxane compound has an epoxy group, an acid component that has been generated from the photoacid generator as the component (D) described above during exposure might react with the epoxy group.

Examples of the siloxane compound having no epoxy group include unmodified siloxane compounds, non-reactive group-modified siloxane compounds such as alkoxy-modified siloxane compounds, polyether-modified siloxane compounds, fluorine-modified siloxane compounds, methylstyryl-modified siloxane compounds, higher fatty acid ester-modified siloxane compounds, specially hydrophilically modified siloxane compounds, and higher alkoxy-modified siloxane compounds, reactive group-modified siloxane compounds such as amino-modified siloxane compounds, carboxy-modified siloxane compounds, carbinol-modified siloxane compounds, methacryl-modified siloxane compounds, mercapto-modified siloxane compounds, and phenol-modified siloxane compounds, and the like.

Preferable among these siloxane compounds as the component (E) are unmodified siloxane compounds and carbinol-modified siloxane compounds because they readily offer compatibility with the acrylic polymer as the component (A), and fluorine-modified siloxane compounds because they offer oleophobicity.

The fluorine-modified siloxane compound herein refers to the organosiloxane compound described above, the organosiloxane compound described above that is partly substituted with a hydrogen atom or a hydroxy group, and a modified product thereof, each of which is further modified with fluorine.

The fluorine-modified siloxane compound is specifically a siloxane compound in which $R^1$ and/or $R^2$ in Formula (70) is a fluoroalkyl group.

The introduction amount of the fluoroalkyl group is preferably 10 to 100% and is more preferably 20 to 80%. In the case where the introduction amount of the fluoroalkyl group is low, oleophobicity may deteriorate, and in the case where the introduction amount of the fluoroalkyl group is too high, resistance to UV/ozone treatment may deteriorate.

Among these compounds described above, the siloxane compound as the component (E) used in the present invention is more preferably a carbinol-modified siloxane compound, a fluorine-modified siloxane compound, or a siloxane compound that is modified with fluorine alone, and is particularly preferably a fluorine-modified siloxane compound that is obtained by modifying an unmodified siloxane compound with fluorine, that is, a siloxane compound that has undergone no modification except for fluorine-modification.

The siloxane compound as the component (E) used in the present invention is preferably a compound having a number average molecular weight of 100 to 2,000 from the viewpoints of being excellent in compatibility with each component, in particular compatibility with the acrylic polymer as the component (A), and being excellent in the stability of the positive photosensitive resin composition, in a solution of the positive photosensitive resin composition of the present invention, as well as of providing solubility in a developer solution and providing water repellency and oleophobicity on the upper surface of a remaining pattern, namely, a region that has never undergone exposure (a part that transmits no light).

The present invention may further include a compound containing two or more vinyl ether groups per molecule as the component (F).

The component (F) has only to be a compound containing two or more vinyl ether groups per molecule that can undergo thermal crosslinking with the acrylic polymer as the component (A) at a commonly pre-baking temperature (80° C. to 150° C., for example), and the types and the structure thereof are not particularly limited.

The compound as the component (F) undergoes thermal crosslinking with the acrylic polymer as the component (A), separates (crosslink breakage) from the acrylic polymer as the component (A) by the action of an acid that has generated on exposure in the presence of a photoacid generator, and is then removed together with the acrylic polymer as the component (A) by development with an alkaline developer solution. Therefore, as such a compound, a vinyl ether compound that is generally used as a component of a vinyl ether-based chemically amplified resist, or the like may be used. The use of such a compound has an advantage of being able to change the formulation amount of the compound to adjust thermal crosslink density so as to control the shape of the film to be formed.

Among these vinyl ether compounds, ones that are particularly preferable to be used as the compound as the component (F) from the viewpoint of achieving development with no residual film nor residue left in an exposed portion are compounds of Formula (71) and Formula (72):

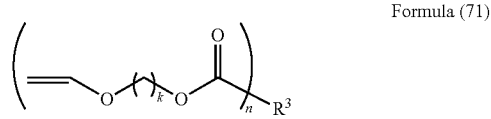

Formula (71)

(where n is an integer of 2 to 10, k is an integer of 1 to 10, and $R^3$ is an n-valent organic group),

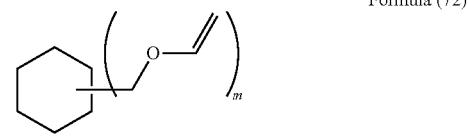

Formula (72)

(where m is an integer of 2 to 10).

n in Formula (71) is the number of vinyl ether groups per molecule, and is more preferably an integer of 2 to 4. m in Formula (72) is also the number of vinyl ether groups per molecule, and m is more preferably an integer of 2 to 4.

Specific examples of the compounds of Formula (71) and Formula (72) include bis(4-(vinyloxymethyl)cyclohexylmethyl) glutarate, tri(ethylene glycol)divinyl ether, adipic acid divinyl ester, diethylene glycol divinyl ether, tris(4-vinyloxy) butyl trimellilate, bis(4-(vinyloxy)butyl) terephthalate, bis(4-(vinyloxy)butyl) isophthalate, cyclohexanedimethanol divinyl ether, and the like.

<Another Additive>

The positive photosensitive resin composition of the present invention can further contain, where appropriate, an adhesive aid such as a surfactant, a rheology modifier, and a silane coupling agent, a pigment, a dye, a storage stabilizer, an antifoaming agent, a dissolution promoter such as a polyphenol and a polycarboxylic acid, and/or the like provided that the effects of the present invention is not impaired.

[Positive Photosensitive Resin Composition]

The positive photosensitive resin composition of the present invention is a composition that includes the acrylic polymer as the component (A), the acrylic polymer as the component (B), the acrylic polymer as the component (C), and the photoacid generator as the component (D), and can further include, as desired, the siloxane compound as the component (E), the compound containing two or more vinyl ether groups per molecule as the component (F), and one or more of the another additives provided that the effects of the present invention is not impaired.

A preferable positive photosensitive resin composition of the present invention among these is as follows.

[1]: A positive photosensitive resin composition including 5 to 50 parts by mass of the component (B), 0.5 to 30 parts by mass of the component (C), and 0.1 to 20 parts by mass of the component (D), relative to 100 parts by mass of the component (A).

[2]: The positive photosensitive resin composition of [1] that includes 8 to 40 parts by mass of the component (B), 1 to 20 parts by mass of the component (C), or 0.5 to 10 parts by mass of the component (D), relative to 100 parts by mass of the component (A).

In the case where the siloxane compound as the component (E) is used, the proportion thereof is preferably 0.05 to 10 parts by mass relative to 100 parts by mass of the acrylic polymer as the component (A).

Using the compound as the component (E) in an amount that exceeds this range may cause blushing or a non-uniform film at the time of forming a coating film.

By selecting the types and the amount of the siloxane compound as the component (E), as needed, the size of a hole to be created in a resulting coating film and a resulting cured film can be controlled.

In the case where the compound containing two or more vinyl ether groups per molecule as the component (F) is used, the proportion thereof is 0.5 to 10 parts by mass relative to 100 parts by mass of the acrylic polymer as the component (A).

Using the compound as the component (F) in an amount that exceeds this range greatly deteriorates the sensitivity of a film, resulting in a residue to be left between patterns after development.

The positive photosensitive resin composition of the present invention may be a state of being dissolved in a solvent (component (G)). The solvent (G) may be a solvent that dissolves the components (A) to (D) and, as desired, the component (E), the component (F), and the another additive, and the types, the structure, and the like of the solvent (G) are not particularly limited provided that the solvent (G) has such dissolving ability.

Examples of the solvent (G) include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, 2-heptanone, .gamma.-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methyl-2-pyrrolidone, and the like.

These solvents can be used alone or as a combination of two or more of these.

More preferable among these solvents (G) are propylene glycol monomethyl ether, propylene glycol monomethyl ether acetate, 2-heptanone, propylene glycol propyl ether, propylene glycol propyl ether acetate, ethyl lactate, butyl lactate, and the like, from the viewpoints of being excellent in coating film properties and being highly safe. These solvents are generally used as a solvent for a photoresist material.

The proportion of the solid content in the positive photosensitive resin composition of the present invention is not particularly limited provided that each component is homogeneously dissolved in a solvent. The proportion of the solid content in the positive photosensitive resin composition of the present invention is 1 to 80% by mass, for example, is 5 to 60% by mass, for example, or is 10 to 50% by mass. The solid content herein refers to all the components of the positive photosensitive resin composition except for the solvent (G).

The method for preparing the positive photosensitive resin composition of the present invention is not particularly limited, and examples thereof include a method of dissolving the component (A) in the solvent (G), followed by mixing thereto the component (B), the component (C), and the component (D) (photoacid generator) at a predetermined proportion to obtain a homogeneous solution, and a method where, in an appropriate step in the above method, at least one type selected from the group consisting of the component (E) (siloxane compound), the component (F) (compound containing two or more vinyl ether groups per molecule), and the another additive is further added and is mixed, where appropriate.

In preparing the positive photosensitive resin composition of the present invention, the solutions of the acrylic polymers as the components (A) to (C) that are obtained at the time of producing the acrylic polymers as the components (A) to (C) can be used as they are. At the time of adding the component (B) (or the solution of the component (B)), the component (C) (or the solution of the component (C)), the component (D), and the like to the solution of the component (A) in the same manner as above to obtain a homogeneous solution, the solvent (G) may be further added so as to adjust the concentration. The solvent used in preparing the acrylic polymers as the components (A) to (C) may be the same as or different from the solvent (G) used in adjusting the concentration at the time of preparing the positive photosensitive resin composition.

The solution of the positive photosensitive resin composition thus prepared is preferably used after filtration using a filter with a pore size of about 0.2 µm, or the like.

<Coating Film and Cured Film>

The positive photosensitive resin composition of the present invention is applied to a semiconductor substrate (a silicon/silicon dioxide-coated substrate, a silicon nitride substrate, a substrate coated with a metal such as aluminum, molybdenum, and chromium, a glass substrate, a quartz substrate, an ITO substrate, for example) by spin coating, curtain coating, roll coating, slit coating, slit coating followed by spin coating, ink-jet coating, or the like, followed by predrying with a hot plate, an oven, or the like, and therefore a coating film can be formed. The coating film is then subjected to heat treatment to form a positive photosensitive resin film.

As for the conditions in the heat treatment, the heating temperature and the heating time are selected, as needed, from the temperature range of 70° C. to 160° C. and the time range of 0.3 to 60 minutes, for example. The heating temperature and the heating time are preferably 80° C. to 140° C. and 0.5 to 10 minutes.

The film thickness of the positive photosensitive resin film formed from the positive photosensitive resin composition is 0.1 to 30 µm, for example, is 0.2 to 10 µm, for example, and is 0.2 to 5 µm, for example.

The positive photosensitive resin film thus formed is a film that is sparingly soluble in an alkaline developer solution because the acrylic polymer as the component (C) is crosslinked with the acrylic polymer as the component (A) by heat treatment at the time of forming the positive photosensitive resin film. In this case, when the temperature during heat treatment is lower than the lower limit of the above temperature range, thermal crosslinking may not proceed adequately, resulting in film loss in an unexposed portion. In the case where the temperature during heat treatment exceeds the upper limit of the above temperature range, thermal crosslinking that has once formed may be cut, resulting in film loss in an unexposed portion.

When the positive photosensitive resin film formed from the positive photosensitive resin composition of the present invention is exposed to light such as ultraviolet light, ArF, KrF, and $F_2$ laser light using a mask having a predetermined pattern, the exposed portion of the film becomes soluble in an alkaline developer solution by the action of an acid generated by the photoacid generator (PAG) as the component (D) included in the positive photosensitive resin film.

Subsequently, the positive photosensitive resin film undergoes post-exposure baking (PEB). As for the conditions in heating, the heating temperature and the heating time are selected, as needed, from the temperature range of 50° C. to 150° C. and the time range of 0.3 to 60 minutes.

Subsequently, development is performed using an alkaline developer solution. By development, a part of the positive photosensitive resin film that has undergone exposure is removed to form a pattern-like relief.

Examples of the alkaline developer solution that can be used include aqueous alkaline solutions including aqueous solutions of an alkali metal hydroxide such as potassium hydroxide and sodium hydroxide, aqueous solutions of a quaternary ammonium hydroxide such as tetramethylammonium hydroxide, tetraethylammonium hydroxide, and choline, and aqueous solutions of an amine such as ethanolamine, propylamine, and ethylenediamine. A surfactant and/or the like can be further added to the developer solution.

Among these alkaline developer solutions, an aqueous solution of 0.1 to 2.38% by mass of tetraethylammonium hydroxide is generally used as a developer solution for a photoresist, and can be used for the positive photosensitive resin composition of the present invention to perform excellent development without causing problems such as swelling.

Development can be performed by puddling, dipping, shaking and dipping, or the like. The development time is usually 15 to 180 seconds.

After development, the positive photosensitive resin film is washed with running water for, for example, 20 to 90 seconds, and is then air dried with compressed air or compressed nitrogen or by spinning to remove moisture on the substrate, whereby a patterned film is obtained.

Subsequently, the patterned film undergoes post-baking, specifically heating with a hot plate, an oven, or the like, for thermosetting to obtain a film that is excellent in heat resistance, transparency, flatness, low water absorption, chemical resistance, and the like and has an excellent relief pattern.

Post-baking is generally performed by treating the film at a heating temperature selected from the temperature range of 130° C. to 250° C. for 5 to 30 minutes on a hot plate or for 30 to 90 minutes in an oven.

By post-baking thus performed, a desired cured film having an excellent pattern profile can be obtained.

As described above, from the positive photosensitive resin composition of the present invention, a fine image that has adequate sensitivity and undergoes little film loss in an unexposed portion during development can be formed.

The cured film is highly water repellent and highly oleophobic on the surface, and therefore degradation in the water repellency and the oleophobicity after oxygen plasma treatment (UV/ozone treatment) can be inhibited.

The cured film after post-baking is a film that can dissolve in various solvents by the action of an acid dissociable group contained in the components (A) to (C) and is excellent in reworkability. Examples of the solvent used in reworking include the following: glycol ethers such as ethylene glycol monomethyl ether, ethylene glycol monoethyl ether, diethylene glycol monomethyl ether, diethylene glycol monoethyl ether, and propylene glycol monomethyl ether; glycol esters such as methyl cellosolve acetate, ethyl cellosolve acetate, propylene glycol monomethyl ether acetate, and propylene glycol propyl ether acetate; glycols such as diethylene glycol, propylene glycol, butylene glycol, and hexylene glycol; alcohols such as methanol, ethanol, 2-propanol, and butanol; ketones such as acetone, methyl ethyl ketone, cyclopentanone, cyclohexanone, 2-heptanone, and γ-butyrolactone; esters such as methyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, methyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate; and amides such as N,N-dimethylformamide, N,N-dimethylacetamide, and N-methyl-2-pyrrolidone.

Because of the above reasons, the cured film is suitably used in applications including a bank for separating pixels in an organic EL, an array of planarization films in a TFT liquid crystal device, and various films in a liquid crystal display or an organic EL display, such as an interlayer insulating film, a protective layer, and an insulating film, for example.

EXAMPLES

The present invention will be described in more detail by examples. The scope of the present invention is, however, not limited to these examples. The measurement of a number average molecular weight and a weight average molecular weight was performed as follows.

[Measurement of Number Average Molecular Weight and Weight Average Molecular Weight]

The number average molecular weight and the weight average molecular weight of the copolymers obtained in the following Synthesis Examples were measured using a GPC device (Shodex® column KF803L and KF804L) manufactured by JASCO Corporation under a condition where tetrahydrofuran as an elution solvent flowed through the column (column temperature: 40° C.) at a flow rate of 1 ml/minute for elution. The number average molecular weights (hereinafter, called Mn) and the weight average molecular weights (hereinafter, called Mw) described below are shown as the values in terms of polystyrene.

Abbreviations to be used in the following examples mean as follows.

<Monomer>

HEMA: 2-hydroxyethyl methacrylate

MMA: methyl methacrylate

CHMI: N-cyclohexylmaleimide

BEMA: 1-butoxyethyl methacrylate

MOI: 2-(O-[1'-methylpropylideneamino]carboxyamino)ethyl methacrylate

TMSSMA: methacryloxypropyl-tris(trimethylsiloxy)silane

PFOMA: 2-(perfluorooctyl)ethyl methacrylate

PFHMA: 2-(perfluorohexyl)ethyl methacrylate

TFMMA: trifluoromethyl methacrylate

MAA: methacrylic acid

<Polymerization Initiator>

AIBN: α,α'-azobisisobutyronitrile

<Photoacid Generator>
PAG1: an oxime sulfonate photoacid generator PAG103 (manufactured by Ciba Japan K.K.)

<Siloxane Compound>
Si1: SH-28PA (manufactured by Dow Corning Toray Silicone Co., Ltd.)
Si2: polydimethylsiloxane-co-polydiphenylsiloxane with a hydroxy terminal
<Compound Containing Two or More Vinyl Ether Groups Per Molecule>
VE1: tris(vinyloxybutyl)trimellitate
<Solvent>
PMA: propylene glycol monomethyl ether acetate Synthesis Example 1

45.0 g of CHMI, 15.0 g of HEMA, 25.0 g of BEMA, 3.0 g of MAA, 12 g of MMA, and 4.4 g of AIBN were dissolved in 230.6 g of PMA, followed by a reaction at 90° C. for 20 hours to obtain an acrylic polymer solution (solid content: 30% by mass) (P1). The resulting acrylic polymer had an Mn of 4,700 and an Mw of 9,800.

Synthesis Example 2

69.0 g of MOI, 23.0 g of BEMA, 23 g of MMA, and 5.2 g of AIBN were dissolved in 309.2 g of PMA, followed by a reaction at 85° C. for 20 hours to obtain an acrylic polymer solution (solid content: 28% by mass) (P2). The resulting acrylic polymer had an Mn of 4,900 and an Mw of 9,500.

Synthesis Example 3

69.0 g of MOI, 23.0 g of BEMA, 23 g of CHMI, and 5.2 g of AIBN were dissolved in 309.2 g of PMA, followed by a reaction at 85° C. for 20 hours to obtain an acrylic polymer solution (solid content: 28% by mass) (P3). The resulting acrylic polymer had an Mn of 5,900 and an Mw of 10,300.

Synthesis Example 4

32.0 g of TMSSMA, 12.0 g of HEMA, 12.0 g of BEMA, 20.0 g of PFHMA, 4.0 g of MMA, and 2.3 g of AIBN were dissolved in 192.0 g of PMA, followed by a reaction at 90° C. for 20 hours to obtain an acrylic polymer solution (solid content: 30%© by mass) (P4). The resulting acrylic polymer had an Mn of 4,900 and an Mw of 8,400.

Synthesis Example 5

32.0 g of TMSSMA, 12.0 g of HEMA, 12.0 g of BEMA, 20.0 g of PFOMA, 4.0 g of MMA, and 2.3 g of AIBN were dissolved in 192.0 g of PMA, followed by a reaction at 90° C. for 20 hours to obtain an acrylic polymer solution (solid content: 30% by mass) (P5). The resulting acrylic polymer had an Mn of 4,300 and an Mw of 7,900.

Synthesis Example 6

32.0 g of TMSSMA, 12.0 g of HEMA, 12.0 g of BEMA, 20.0 g of TFMMA, 4.0 g of MMA, and 2.3 g of AIBN were dissolved in 192.0 g of PMA, followed by a reaction at 90° C. for 20 hours to obtain an acrylic polymer solution (solid content: 30% by mass) (P6). The resulting acrylic polymer had an Mn of 4,700 and an Mw of 8,600.

Synthesis Example 7

15.0 g of HEMA, 25.0 g of BEMA, 48.0 g of MAA, 12 g of MMA, and 4.4 g of AIBN were dissolved in 230.6 g of PMA, followed by a reaction at 90° C. for 20 hours to obtain an acrylic polymer solution (solid content: 30% by mass) (P7). The resulting acrylic polymer had an Mn of 5,500 and an Mw of 10,300.

Synthesis Example 8

45.0 g of CHMI, 25.0 g of BEMA, 3.0 g of MAA, 27 g of MMA, and 4.4 g of AIBN were dissolved in 230.6 g of PMA, followed by a reaction at 90° C. for 20 hours to obtain an acrylic polymer solution (solid content: 30% by mass) (P8). The resulting acrylic polymer had an Mn of 4,400 and an Mw of 9,300.

Synthesis Example 9

32.0 g of TMSSMA, 12.0 g of BEMA, 20.0 g of PFHMA, 16.0 g of MMA, and 2.3 g of AIBN were dissolved in 192.0 g of PMA, followed by a reaction at 90° C. for 20 hours to obtain an acrylic polymer solution (solid content: 30% by mass) (P9). The resulting acrylic polymer had an Mn of 4,100 and an Mw of 7,900.

Synthesis Example 10

32.0 g of TMSSMA, 12.0 g of HEMA, 12.0 g of BEMA, 20.0 g of PFHMA, 4.0 g of CHMI, and 2.3 g of AIBN were dissolved in 192.0 g of PMA, followed by a reaction at 90° C. for 20 hours to obtain an acrylic polymer solution (solid content: 30% by mass) (P10). The resulting acrylic polymer had an Mn of 5,200 and an Mw of 8,700.

Synthesis Example 11

15.3 g of MAA, 35.5 g of CHMI, 25.5 g of HEMA, 23.7 g of MMA, and 5.0 g of AIBN were dissolved in 233.3 g of PMA, followed by a reaction at 90° C. for 20 hours to obtain an acrylic polymer solution (solid content: 30% by mass) (P 11). The resulting acrylic polymer had an Mn of 4,100 and an Mw of 7,600.

Synthesis Example 12

6.7 g of CHMI, 6.7 g of HEMA, 3.3 g of MAA, 25.0 g of TMSSMA, 14.7 g of PFHMA, 10.0 g of BEMA, and 2.3 g of AIBN were dissolved in 160.8 g of PMA, followed by a reaction at 90° C. for 20 hours to obtain an acrylic polymer solution (solid content: 30% by mass) (P 12). The resulting acrylic polymer had an Mn of 5,400 and an Mw of 8,600.

TABLE 1

| Synthesis Ex. | No. | Monomer used [g; mmol] | | | | |
|---|---|---|---|---|---|---|
| Synthesis Example 1 | P1 | CHMI [45.0; 251] | HEMA [15.0; 115] | BEMA [25.0; 134] | MAA [3.0; 34.9] | MMA [12; 120] |
| Synthesis Example 2 | P2 | MOI [69.0; 285] | BEMA [23.0; 123] | MMA [23; 230] | | |
| Synthesis Example 3 | P3 | MOI [69.0; 285] | BEMA [23.0; 123] | CHMI [23; 128] | | |
| Synthesis Example 4 | P4 | TMSSMA [32.0; 75.7] | HEMA [12.0; 92.2] | BEMA [12.0; 64.4] | PFHMA [20.0; 46.3] | MMA [4.0; 40.0] |
| Synthesis Example 5 | P5 | TMSSMA [32.0; 75.7] | HEMA [12.0; 92.2] | BEMA [12.0; 64.4] | PFOMA [20.0; 37.5] | MMA [4.0; 40.0] |
| Synthesis Example 6 | P6 | TMSSMA [32.0; 75.7] | HEMA [12.0; 92.2] | BEMA [12.0; 64.4] | TFMMA [20.0; 130] | MMA [4.0; 40.0] |
| Synthesis Example 7 | P7 | HEMA [15.0; 115] | BEMA [25.0; 134] | MAA [48.0; 558] | MMA [12; 120] | |
| Synthesis Example 8 | P8 | CHMI [45.0; 251] | BEMA [25.0; 134] | MAA [3.0; 34.9] | MMA [27; 270] | |
| Synthesis Example 9 | P9 | TMSSMA [32.0; 75.7] | BEMA [12.0; 64.4] | PFHMA [20.0; 46.3] | MMA [16.0; 160] | |
| Synthesis Example 10 | P10 | TMSSMA [32.0; 75.7] | HEMA [12.0; 64.4] | BEMA [12.0; 64.4] | PFHMA [20.0; 46.3] | CHMI [4.0; 22.3] |
| Synthesis Example 11 | P11 | CHMI [35.5; 198] | HEMA [25.5; 196] | MAA [15.3; 177] | MMA [23.7; 237] | |

TABLE 2

| Synthesis Ex. | No. | Monomer used [g; mmol] | | | | | |
|---|---|---|---|---|---|---|---|
| Synthesis Example 12 | P12 | CHMI [6.7; 53.7] | HEMA [6.7; 51.2] | MAA [3.3; 38.7] | TMSSMA [25.0; 59.9] | PFHMA [14.7; 33.9] | BEMA [10.0; 53.7] |

Examples 1 to 7 and Comparative Examples 1 to 5

According to the composition shown in Table 3 below, a solution of a component (A), a solution of a component (B), a solution of a component (C), a component (D), a component (E), and a component (F) were dissolved in a solvent (G) at a predetermined proportion, followed by stirring at room temperature for 3 hours to obtain a homogeneous solution, thereby preparing a positive photosensitive resin composition of each Example or each Comparative Example.

TABLE 3

| | Solution of component (A) (g) | Solution of component (B) (g) | Solution of component (C) (g) | Component (D) (g) | Component (E) (g) | Component (F) (g) | Solvent (G) (g) |
|---|---|---|---|---|---|---|---|
| Example 1 | P1 14.2 | P2 2.3 | P4 1.7 | PAG1 0.17 | Si 1 0.25 | — | PMA 1.2 |
| Example 2 | P1 14.2 | P3 2.3 | P4 1.7 | PAG1 0.17 | Si 1 0.25 | — | PMA 1.2 |
| Example 3 | P1 14.2 | P2 2.3 | P5 1.7 | PAG1 0.17 | Si 1 0.25 | — | PMA 1.2 |
| Example 4 | P1 14.2 | P2 2.3 | P4 1.7 | PAG1 0.17 | Si 2 0.25 | — | PMA 1.2 |
| Example 5 | P1 14.2 | P2 2.3 | P10 1.7 | PAG1 0.17 | Si 1 0.25 | — | PMA 1.2 |
| Example 6 | P1 14.2 | P2 2.3 | P4 1.7 | PAG1 0.17 | — | — | PMA 0.60 |
| Example 7 | P1 14.2 | P2 2.6 | P12 1.4 | PAG1 0.17 | Si 1 0.14 | VE1 0.14 | PMA 0.82 |
| Comparative Example 1 | P1 14.2 | P2 2.3 | — | PAG1 0.17 | Si 1 0.25 | — | PMA 1.0 |
| Comparative Example 2 | P1 14.2 | P2 2.3 | P6 1.7 | PAG1 0.17 | Si 1 0.25 | — | PMA 1.2 |
| Comparative Example 3 | P7 14.2 | P2 2.3 | P4 1.7 | PAG1 0.17 | Si 1 0.25 | — | PMA 1.2 |
| Comparative Example 4 | P8 14.2 | P2 2.3 | P9 1.7 | PAG1 0.17 | Si 1 0.25 | — | PMA 1.2 |
| Comparative Example 5 | P11 14.2 | P2 2.3 | P4 1.7 | PAG1 0.17 | Si 1 0.25 | VE1 0.65 | PMA 2.8 |

[Evaluation of Contact Angle]

A positive photosensitive resin composition was applied to a silicon wafer using a spin coater, followed by pre-baking at a temperature of 100° C. for 120 seconds on a hot plate to form a coating film of a film thickness of 2.5 μm. The coating film was immersed in an aqueous solution of 0.4% by mass of tetramethylammonium hydroxide (hereinafter, called TMAH) for 60 seconds, followed by washing with running ultrapure water for 20 seconds. Then, the coating film was heated at a temperature of 230° C. for 30 minutes to perform post-baking, thereby forming a cured film of a film thickness of 2.0 μm. The contact angles of the cured film with water and anisole were measured using a Drop Master manufactured by Kyowa Interface Science Co., Ltd. The results obtained are shown in Table 4.

[Evaluation of Resistance to UV/Ozone Treatment]

A positive photosensitive resin composition was applied to a silicon wafer using a spin coater, followed by pre-baking at a temperature of 100° C. for 120 seconds on a hot plate to form a coating film of a film thickness of 2.5 μm. The coating film was immersed in an aqueous solution of 0.4% by mass of tetramethylammonium hydroxide (hereinafter, called TMAH) for 60 seconds, followed by washing with running ultrapure water for 20 seconds. Then, the coating film was heated at a temperature of 230° C. for 30 minutes to perform post-baking, thereby forming a cured film of a film thickness of 2.0 μm. The cured film was washed with ozone using UV-312 manufactured by Technovision, Inc. for 10 minutes. The contact angles of the film thus ozone-washed with water and anisole were measured using a Drop Master manufactured by Kyowa Interface Science Co., Ltd. The results obtained are shown in Table 4.

[Evaluation of Pattern Profile]

A positive photosensitive resin composition was applied to a silicon wafer using a spin coater, followed by pre-baking at a temperature of 100° C. for 120 seconds on a hot plate to form a coating film of a film thickness of 2.5 μm. The coating film was subjected to ultraviolet radiation at light intensity at 365 nm of 5.5 mW/cm$^2$ through a mask with a 20-μm line and space pattern by an ultraviolet irradiation device PLA-600FA manufactured by Canon Inc. for a certain period of time, followed by post-exposure baking (PEB) at a temperature of 110° C. for 120 seconds on a hot plate. The resultant was then immersed in a 0.4% aqueous TMAH solution for 60 seconds to perform development, followed by washing with running ultrapure water for 20 seconds. The coating film on which the line and space pattern was formed was heated at a temperature of 230° C. for 30 minutes for post-baking to cure the film. The cross section of the line and space pattern thus cured was observed by a scanning electron microscope S-4100 manufactured by Hitachi High-Technologies Corporation. The results obtained are shown in Table 4.

[Evaluation of Solvent Resistance]

A positive photosensitive resin composition was applied to a silicon wafer using a spin coater, followed by pre-baking at a temperature of 100° C. for 120 seconds on a hot plate to form a coating film of a film thickness of 2.5 μm. The coating film was immersed in an aqueous solution of 0.4% by mass of tetramethylammonium hydroxide (hereinafter, called TMAH) for 60 seconds, followed by washing with running ultrapure water for 20 seconds. Then, the coating film was heated at a temperature of 230° C. for 30 minutes to perform post-baking, thereby forming a cured film of a film thickness of 2.0 μm. The cured film was immersed in N-methyl-2-pyrrolidone for 1 minute, and then the film thickness was measured. A cured film the film thickness of which was observed to had changed less than 3% since the completion of post-baking was evaluated as ○, and a cured film the film thickness of which was observed to had changed 3% or more since the completion of post-baking was evaluated as x. The results obtained are shown in Table 4.

[Evaluation of Sensitivity]

A positive photosensitive resin composition was applied to a silicon wafer using a spin coater, followed by pre-baking at a temperature of 100° C. for 120 seconds on a hot plate to form a coating film of a film thickness of 2.5 μm. The coating film was subjected to ultraviolet radiation at light intensity at 365 nm of 5.5 mW/cm$^2$ by an ultraviolet irradiation device PLA-600FA manufactured by Canon Inc. for a certain period of time, followed by post-exposure baking (PEB) at a temperature of 110° C. for 120 seconds on a hot plate. The resultant was then immersed in a 0.4% aqueous TMAH solution for 60 seconds to perform development, followed by washing with running ultrapure water for 20 seconds. The lowest exposure dose (mJ/cm$^2$) that achieved complete dissolution in an exposed portion was called sensitivity. The results obtained are shown in Table 4.

[Evaluation of Storage Stability]

After stored at 23° C. for 1 week, a positive photosensitive resin composition the viscosity of which was observed to have changed 10% or more from the viscosity thereof after preparation was evaluated as x, and a positive photosensitive resin composition the viscosity of which was observed to have changed 10% or less from the viscosity thereof after preparation was evaluated as ○. The results obtained are shown in Table 4.

[Evaluation of Reworkability]

A positive photosensitive resin composition was applied to a silicon wafer using a spin coater, followed by pre-baking at a temperature of 100° C. for 120 seconds on a hot plate to form a coating film of a film thickness of 2.5 μm. The coating film was subjected to ultraviolet radiation at light intensity at 365 nm of 5.5 mW/cm$^2$ through a mask with a 20-μm line and space pattern by an ultraviolet irradiation device PLA-600FA manufactured by Canon Inc. for a certain period of time, followed by post-exposure baking (PEB) at a temperature of 110° C. for 120 seconds on a hot plate. The resultant was then immersed in a 0.4% aqueous TMAH solution for 60 seconds to perform development, followed by washing with running ultrapure water for 20 seconds. The resulting line and space pattern was immersed in PGMEA for 2 minutes. A sample in which the pattern completely disappeared was evaluated as ○, and a sample in which the pattern remained was evaluated as x. The results obtained are shown in Table 4.

TABLE 4

| | Contact angle (water) | | Contact angle (anisole) | | | | | | |
|---|---|---|---|---|---|---|---|---|---|
| | After PB | After UV-O$_3$ | After PB | After UV-O$_3$ | Pattern profile | Solvent resistance | Sensitivity (mJ/cm$^2$) | Storage stability | Reworkability |
| Example 1 | 103 | 101 | 56 | 60 | Trapezoidal | ○ | 50 | ○ | ○ |
| Example 2 | 104 | 101 | 55 | 57 | Trapezoidal | ○ | 75 | ○ | ○ |
| Example 3 | 103 | 102 | 57 | 59 | Trapezoidal | ○ | 50 | ○ | ○ |
| Example 4 | 102 | 100 | 55 | 54 | Trapezoidal | ○ | 50 | ○ | ○ |

TABLE 4-continued

| | Contact angle (water) | | Contact angle (anisole) | | | | | | |
|---|---|---|---|---|---|---|---|---|---|
| | After PB | After UV-O$_3$ | After PB | After UV-O$_3$ | Pattern profile | Solvent resistance | Sensitivity (mJ/cm$^2$) | Storage stability | Reworkability |
| Example 5 | 102 | 101 | 55 | 55 | Trapezoidal | ○ | 70 | ○ | ○ |
| Example 6 | 102 | 85 | 55 | 45 | Trapezoidal | ○ | 55 | ○ | ○ |
| Example 7 | 102 | 99 | 53 | 49 | Trapezoidal | ○ | 60 | ○ | ○ |
| Comparative Example 1 | 72 | 12 | 22 | 10 | Trapezoidal | ○ | 55 | ○ | ○ |
| Comparative Example 2 | 95 | 93 | 41 | 38 | Trapezoidal | ○ | 50 | ○ | ○ |
| Comparative Example 3 | 100 | 98 | 55 | 58 | Semicircular | ○ | 40 | ○ | ○ |
| Comparative Example 4 | 100 | 97 | 53 | 50 | Semicircular | x | 50 | ○ | ○ |
| Comparative Example 5 | 103 | 101 | 56 | 60 | Trapezoidal | ○ | 60 | x | x |

As shown in Table 4, in Example 1 to Example 7, lyophobicity against water and anisole was retained after UV-O$_3$ irradiation. In addition, Example 1 to Example 7 resulted in that no reflow occurred and a trapezoidal pattern profile was retained during post-baking, and the pattern completely disappeared when immersed in propylene glycol monomethyl ether acetate to show excellent reworkability.

By contrast, in Comparative Example 1 and Comparative Example 2, adequate lyophobicity against water and anisole was not obtained after post-baking. Particularly in Comparative Example 1, lyophobicity greatly deteriorated after UV-O$_3$ irradiation. In Comparative Example 3 and Comparative Example 4, reflow occurred and a pattern profile changed from trapezoidal to semicircular during post-baking. Comparative Example 5 resulted in that storage stability was not adequate and reworkability after post-baking was poor.

The invention claimed is:

1. A positive photosensitive resin composition comprising:
   a component (A) comprising an acrylic polymer obtained by polymerizing a monomer mixture that contains a monomer having an acid dissociable group, a monomer having an aliphatic hydroxyl group, and an N-substituted maleimide monomer;
   a component (B) comprising an acrylic polymer containing an acid dissociable group and a blocked isocyanate group;
   a component (C) comprising an acrylic polymer containing an acid dissociable group, an aliphatic hydroxyl group, a C$_{3-10}$ fluoroalkyl group, and a silyl ether defined by the formula:

—X$^4$—Si(O—SiX$^1$X$^2$X$^3$)$_3$ where X$^1$, X$^2$, and X$^3$ are independently a C$_{1-3}$ alkyl group, and X$^4$ is a C$_{1-6}$ alkylene group; and
   a component (D) comprising a photoacid generator.

2. The positive photosensitive resin composition according to claim 1, wherein the acid dissociable groups in the component (A), the component (B), and the component (C) are independently a C$_{2-11}$ alkoxyalkyl troup.

3. The positive photosensitive resin composition according to claim 1, wherein the acrylic polymer of the component (A) contains the acid dissociable group, the aliphatic hydroxyl group, and a group formed by polymerization of the N-substituted maleimide monomer in a molar ratio of 5 to 50:50 to 50:20 to 70, respectively.

4. The positive photosensitive resin composition according to claim 1, wherein the acrylic polymer of the component (B) contains the acid dissociable group and the blocked icocyanate group in a molar ratio of 5 to 50:15 to 80.

5. The positive photosensitive resin composition according to claim 1, wherein the acrylic polymer of the component (C) contains the acid dissociable group, the aliphatic hydroxyl group, the C$_{3-10}$ fluoroalkyl group, and the silyl ether group in a molar ratio of 5 to 40:5 to 50:5 to 50:10 to 60, respectively.

6. The positive photosensitive resin composition according to claim 1, comprising 5 to 50 parts by mass of the component (B), 0.5 to 30 parts by mass of the component (C), and 0.1 to 20 parts by mass of the component (D), relative to 100 parts by mass of the component (A).

7. The positive photosensitive resin composition according to claim 1, further comprising 0.05 to 10 parts by mass of a siloxane compound as a component (E) relative to 100 parts by mass of the component (A).

8. The positive photosensitive resin composition according to claim 1, further comprising 0.5 to 10 parts by mass of a compound containing two or more vinyl ether groups per molecule as a component (F) relative to 100 parts by mass of the component (A).

9. The positive photosensitive resin composition according to claim 1, wherein:
   the acrylic polymer of the component (B) is obtained by polymerizing a monomer mixture that contains a monomer having an acid dissociable group and a monomer having a blocked isocyanate group; and
   the acrylic polymer of the component (C) is obtained by polymerizing a monomer mixture that contains a monomer having an acid dissociable group, a monomer having an aliphatic hydroxyl group, a monomer having a C$_{3-10}$ fluoroalkyl group, and a monomer having a silyl ether group defined by the formula:

—X$^4$—Si(O—SiX$^1$X$^2$X$^3$)$_3$ where X$^1$, X$^2$, and X$^3$ are independently a C$_{1-3}$ alkyl group, and X$^4$ is a C$_{1-6}$ alkylene group.

10. A film that is produced by applying the positive photosensitive resin composition as claimed in claim 1 to a substrate, drying and heating the applied composition to obtain a film, exposing the film to light, and after exposure, baking, developing, washing with running water, and then again baking the film.

11. A display device comprising the film as claimed in claim 10.

12. An organic EL element comprising the film as claimed in claim 10.

13. A method for forming an image, comprising:
applying the positive photosensitive resin composition as claimed in claim 1 to a base material to form a film;
exposing a portion of the film to light;
after exposure, baking the film at a temperature of from 50 to 150° C.; and then
developing the film by removing the exposed portion of the film to form a pattern-like relief.

14. The method for forming an image according to claim 13, further comprising baking the film at a temperature of 130 to 250° C. after development.

* * * * *